United States Patent [19]

Dimitrelis et al.

[11] Patent Number: 5,405,488

[45] Date of Patent: Apr. 11, 1995

[54] SYSTEM AND METHOD FOR PLASMA ETCHING ENDPOINT DETECTION

[75] Inventors: Dimitrios Dimitrelis, Palo Alto; Calvin T. Gabriel, Cupertino; Samuel V. Dunton, San Jose, all of Calif.

[73] Assignee: VLSI Technology, Inc., San Jose, Calif.

[21] Appl. No.: 120,619

[22] Filed: Sep. 13, 1993

[51] Int. Cl.$^6$ .................................... H01L 21/306
[52] U.S. Cl. ................................. 156/627; 156/643
[58] Field of Search ............... 156/643, 626, 627, 345

[56] References Cited

U.S. PATENT DOCUMENTS

| | | | |
|---|---|---|---|
| 4,312,732 | 1/1982 | Degenkolb | 204/192 |
| 4,954,212 | 9/1990 | Gabriel | 156/627 |
| 5,160,402 | 11/1992 | Cheng | 156/627 |
| 5,200,023 | 4/1993 | Gifford | 156/626 |
| 5,242,532 | 9/1993 | Cain | 156/626 |

*Primary Examiner*—R. Bruce Breneman
*Assistant Examiner*—Joni Y. Chang
*Attorney, Agent, or Firm*—Flehr, Hohbach, Test, Albritton & Herbert

[57] ABSTRACT

A plasma etching endpoint detection system monitors two optical wavelengths during etching of a non-opaque dielectric film. A controller coupled to the optical monitoring equipment generates an endpoint detection signal corresponding to a predefined mathematical combination of the monitored intensity of light at the first wavelength and the monitored intensity of light at the second wavelength. When the endpoint detection signal crosses a threshold level, the etching of the dielectric layer is stopped. In a preferred embodiment the two monitored wavelengths differ by approximately a factor of two. More generally, the two monitored wavelengths are selected such that the combined intensity signal has a proportionally smaller false endpoint peak than either of the individual monitored intensity signals. The present invention is beneficial primarily for plasma etching systems in which the optical path of the optical monitoring equipment is not parallel to the surface of wafer being etched, which results in a premature or false endpoint signal produced by alternating constructive and destructive interference between reflected and refracted light.

9 Claims, 6 Drawing Sheets

Δ Path = n'(AB + BC) − AN = $2Hn'/\cos\theta' - 2Hn'\tan\theta'\sin\theta = 2Hn'\cos\theta'$
-->
Constructive Interference for $2Hn'\cos\theta' = m\lambda$
Destructive Interference for $2Hn'\cos\theta' = m\lambda \pm \lambda/2$

SYSTEM AND METHOD FOR PLASMA ETCHING ENDPOINT DETECTION

The present invention relates generally to plasma etch processes used in semiconductor circuit manufacturing and particularly to methods and systems for detecting when a plasma etch process has completed the etching of a dielectric or other non-opaque film on a semiconductor wafer.

BACKGROUND OF THE INVENTION

Plasma etchers are frequently used in semiconductor processing when anisotropic etching is needed to produce a relatively straight vertical edge. For instance, when etching the polysilicon gate of a MOS transistor, a sloped polysilicon edge can adversely affect the operation of the transistor. This is referred to as undercutting. Undercutting is frequently encountered when etching is performed using a liquid etchant. Plasma etching, which uses gaseous ions accelerated by an electric field, tends to etch only horizontally exposed surfaces and therefore avoids undercutting.

An important aspect of all etching processes is stopping the etching process after the layer being etched has been removed but before the next layer down is destroyed. This is often called "endpoint" detection—for detecting the completion of etching of a particular layer.

An example of a situation in which precise endpoint detection is important in fabricating MOS transistors is the processing step in which a thin "spacer" is formed adjacent to an MOS transistor gate. Referring to FIGS. 1A-1D, in FIG. 1A a silicon oxide film is deposited over a polysilicon gate that was defined by a prior etch step. FIG. 1B shows the results of a properly terminated plasma etch of the silicon oxide layer, producing silicon oxide spacers on all sides of the polysilicon gate. FIG. 1C shows that the channel width L1 of the transistor is governed by the width of the silicon oxide spacers. FIG. 1D shows that if the plasma etching of the silicon oxide layer is allowed to continue past its ideal endpoint, the silicon oxide spacers will be thinner than is ideal and resulting transistor channel width L2 will be shorter than the channel width L1 that was supposed to be produced.

Referring to FIG. 2, there is shown a triode etcher system 100, such as a GCA Waferetch 616 triode etcher, having state of the art "endpoint" detection equipment. The system 100 has an etching chamber 102 with upper and lower cathodes 104 and 106, respectively, and a screen anode 108. The screen anode 108 is located between the two cathodes and is grounded. A semiconductor wafer 110 is placed in the chamber on the lower cathode 106. In this example the wafer 110 has a silicon substrate 112 that supports a dielectric layer 114. The dielectric layer 114 has been masked with resist 118 in order to define regions of dielectric layer 114 to be etched. In other situations, such as that shown in FIGS. 1A and 1B, no mask is used, and in still other situations etch masks are formed with materials other than resist. The interior of the etching chamber is filled with a gaseous mixture that becomes a plasma 120 when power is applied to the chamber.

The plasma etching system shown in FIG. 2 has a 13.56 megahertz RF power supply 130 with a characteristic impedance of 50 ohms. The chamber 102, however, has a characteristic impedance of around 1000 ohms at this frequency. Without the use of a compensating circuit, this impedance mismatch would cause most of the power output by the power supply to be reflected off the load (i.e., the chamber) and back to the source, which could damage the power supply 130. To overcome this problem, most or all etching systems use a compensating circuit 132, sometimes called an impedance transformation circuit, which matches the amplifier to the plasma. In a triode etcher such as the one shown in FIG. 2, this circuit typically includes an inductor coil L1 and three tunable capacitors C1, C2 and C3. A controller 134 (typically a programmed, digital microcontroller) automatically monitors the reflected power and adjusts the three capacitors until the reflected power is less than a specified threshold value.

In general, the plasma 120 etches the top layer of the wafer 110 only when the power supply 130 is activated and when the power reflected by the plasma chamber is relatively low. Activating the power supply 130 "strikes" the plasma, and activates the etching process. While etching any particular layer, light is generated at wavelengths corresponding to the reactants (components of the gaseous mixture) used and to the products of the reaction between the components of the plasma and the layer being etched.

In many plasma etching systems the endpoint of the etching process is detected using a light or optical sensor 140 and a digital computer in controller 134. Typically, the optical sensor 140 is set up, using narrow bandpass filters, to monitor the intensity of light at a single characteristic wavelength associated with the reaction products produced by etching the layer or to monitor the intensity of light at a wavelength associated with the gaseous reactants in the plasma used to etch the layer. When the measured intensity falls below a specified threshold or rises above a specified threshold, depending on the wavelength being monitored, the controller 134 generates an endpoint signal that turns off the power supply 130 and thereby stops the etching process.

In conventional etching systems such as that depicted in FIG. 2 the endpoint signal may be generated too early or too late for stopping the etch process at the optimal point. In some instances the delay between completion of the dielectric etch and the subsequent disengagement of the power supply 130 has allowed the plasma to significantly damage the exposed surfaces of the substrate 112. In other circumstances, particularly when etching transparent or translucent dielectric films using a plasma reactor whose optical path for the endpoint detection system is not parallel to the wafer surface, a premature endpoint signal is generated. It is this latter circumstance that is addressed by the present invention.

Many plasma reactors utilize optical endpoint detection systems whose optical path is parallel to the wafer surface, and those systems generally do not experience false, premature endpoint detection signals. However, providing an optical endpoint detection system whose optical path is parallel to the wafer surface generally requires an increased reactor volume.

It is therefore an object of the present invention to provide a reliable endpoint detection method for terminating the etching of dielectric films in plasma reactors that utilize optical endpoint detection apparatus which is not restricted by requiring an optical path parallel to the wafer surface.

SUMMARY OF THE INVENTION

In summary, the present invention is a plasma etching endpoint detection system that monitors sensor intensity signals for light at two distinct optical wavelengths in the plasma during etching of a dielectric film. A controller coupled to the optical monitoring equipment generates an endpoint detection signal corresponding to a predefined mathematical combination of the monitored intensity of light at the first wavelength and the monitored intensity of light at the second wavelength. When the endpoint detection signal crosses a threshold level, the etching of the dielectric layer is stopped.

In a preferred embodiment the two monitored wavelengths differ by approximately a factor of two. More generally, the two monitored wavelengths are selected such that the combined intensity signal has a proportionally smaller false endpoint peak than either of the individual monitored intensity signals. The present invention is beneficial primarily for systems in which the optical path of the optical monitoring equipment is not parallel to the surface of wafer being etched, which results in a premature or false endpoint signal produced by alternating constructive and destructive interference between reflected and refracted light.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1A:
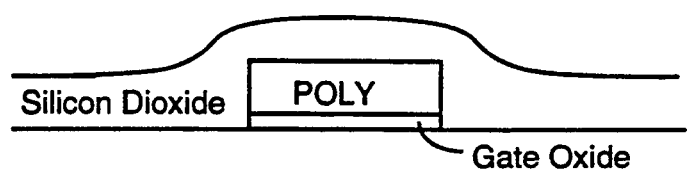
FIGS. 1A–1D show steps for manufacturing an MOS polysilicon-gate transistor.
Figure 1B:
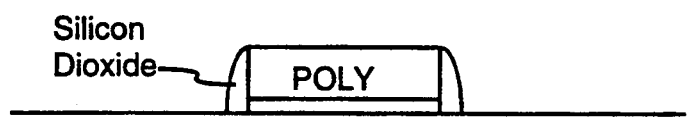
Figure 1C:
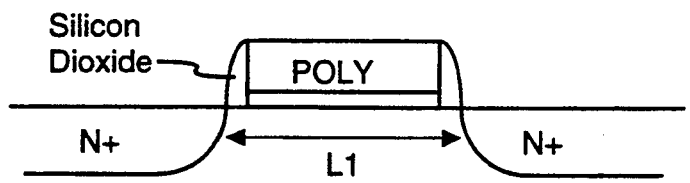
Figure 1D:
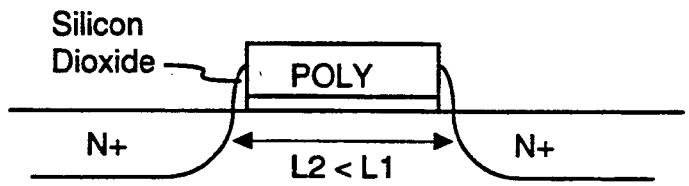
Figure 2:
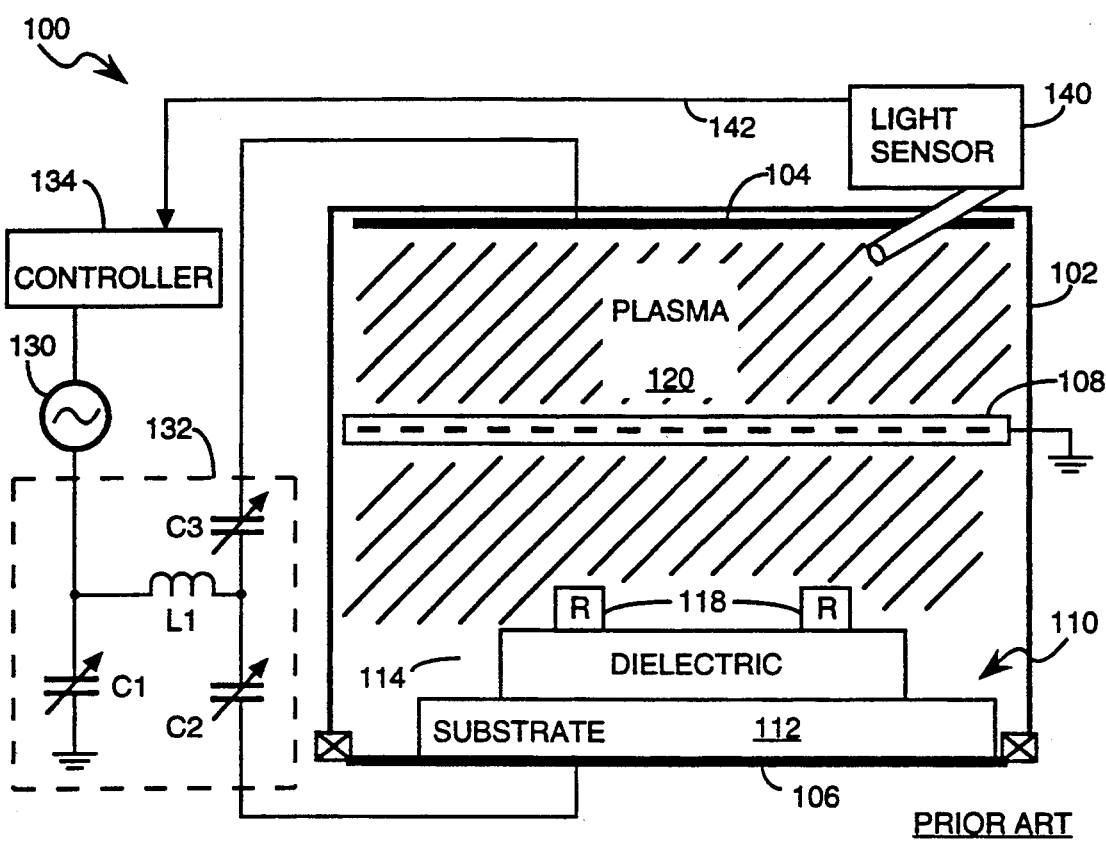
FIG. 2 is a block diagram of a prior art triode plasma etcher system having an optical endpoint detection subsystem.
Figure 3:
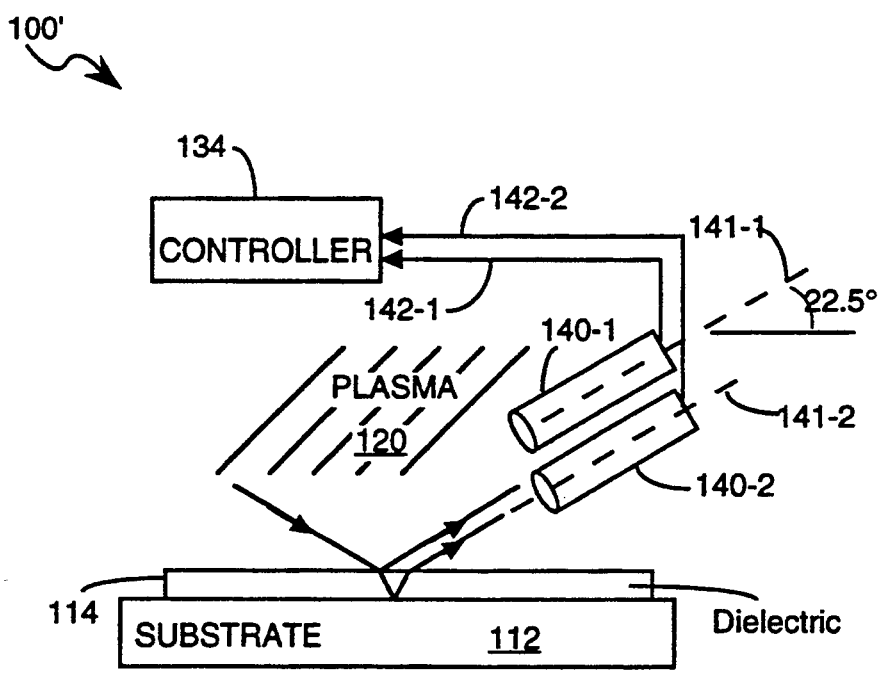
FIG. 3 is a partial block diagram of an endpoint detection system using two optical sensors whose optical paths are not parallel to the surface of wafer being etched.

Referring to FIG. 2, the controller 134 used in a typical plasma etcher comprises a microprocessor or microcontroller operative to control the etching process by monitoring the amount of reflected power while adjusting the capacitances C1–C3 in accordance with a predefined algorithm. As shown in FIG. 3, in a modified version of the plasma etcher system 100' in accordance with the present invention, controller 134 monitors voltage signals on lines 142-1 and 142-2 generated by two light sensors 140-1 and 140-2. The two voltage signals are indicative of the intensity of light generated in the plasma chamber 102 at two selected wavelengths. The controller 134 generates an endpoint detection signal comprising a predefined mathematical combination of the two voltage signals, and terminates the etching process (by turning off power source 130) when the endpoint detection signal passes a threshold value.

For the purposes of the present invention the term "light" is defined to include all electromagnetic radiation emissions generated in a plasma etcher which can be detected by optical sensors, even if the wavelengths of those emissions do not fall in the visible range.

An "endpoint detection signal" is herein defined to be a signal that either falls or rises at the endpoint of a plasma etching process. Light intensity based signals that rise at the etching process endpoint are related to the concentration of reactants in the plasma chamber or to the concentration of products of reactions involving material in the layer below the layer to be etched. Endpoint signals that fall at the etching process endpoint are related to the concentration of reactive intermediates or products of reactions involving the material being etched.

The term "reactants" refers to the gaseous chemicals introduced into the plasma chamber to perform etching, while the term "products" refers to chemicals generated by the etching process.

Figure 4:
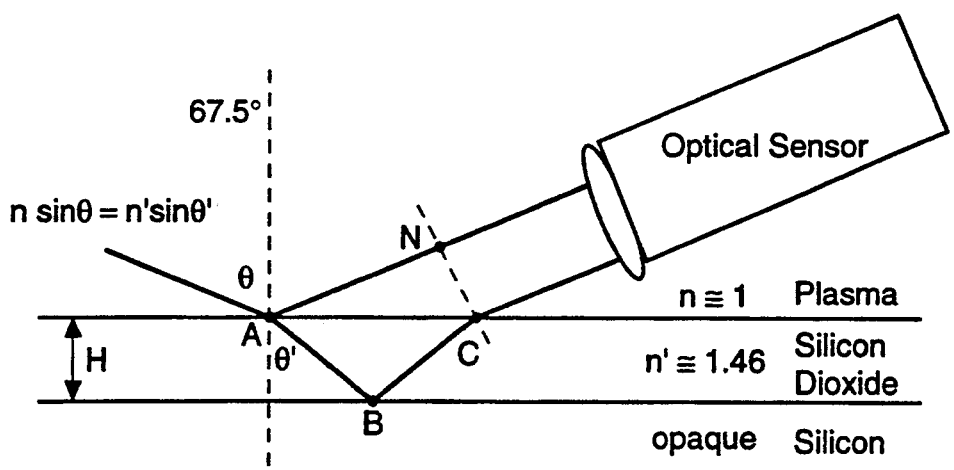
FIG. 4 is a representation of optical paths of light generated in a plasma that is partially reflected and partially refracted by a non-opaque thin film.

As shown in FIGS. 3 and 4, the problem addressed by the invention is caused by interference between (1) light in the plasma chamber that is reflected off the surface of a non-opaque dielectric layer 114 and (2) light that travels through the dielectric layer 114 and then back into the plasma. It is important to note that the optical sensors 140-1, 140-2 have narrow optical paths 141-1, 141-2, such that only light incident on each sensor that is traveling at an angle very close to the optical sensor's internal optical path is detected. The optical sensors in the etcher system shown in FIG. 2 and 3 are oriented at an angle of 22.5 degrees from the wafer surface.

As the dielectric layer 114 is etched, the difference in length of these two optical paths will decrease because the dielectric layer will decrease in thickness. As shown in FIG. 4, when the two optical paths differ by exactly an integer number of wavelengths of the light being monitored by a sensor 140, the two optical signals will interfere constructively so as to generate an optical signal of increased intensity. Similarly, when the two optical paths differ by $m+\frac{1}{2}$ wavelengths, where m is an integer, the two optical signals will interfere destructively so as to generate an optical signal of decreased intensity. In addition, light will be received by the optical sensor 140 directly from the plasma without reflection from the dielectric film.

Figure 5:
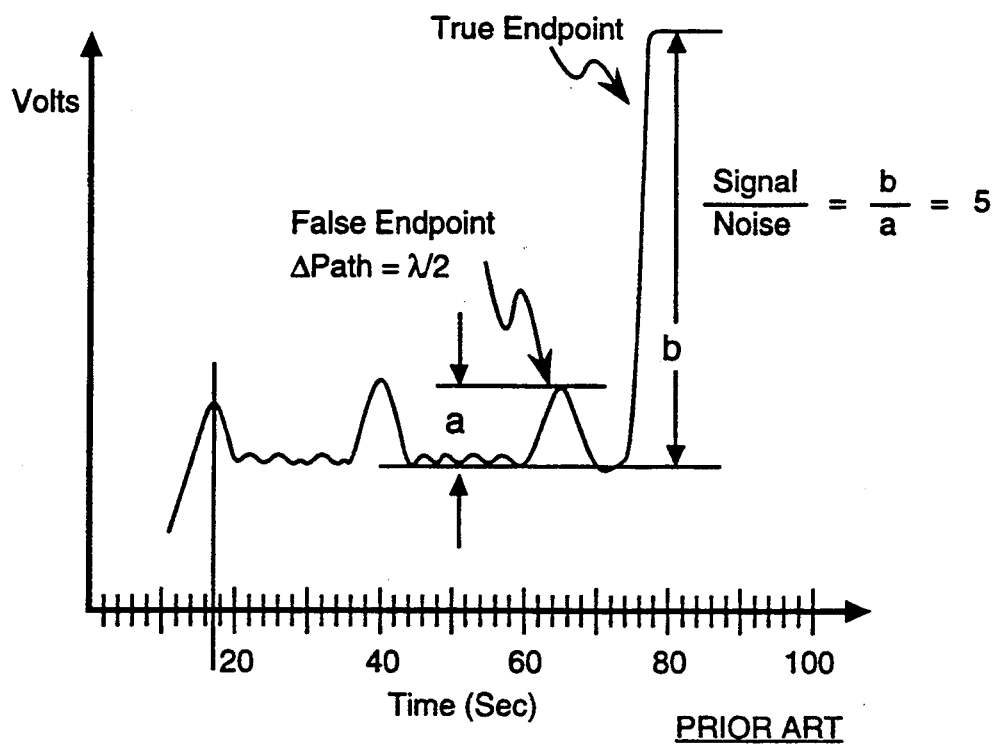
FIG. 5 shows a typical optical intensity trace for a prior art endpoint detection system where the optical path of the endpoint detection system is not parallel to the wafer surface.

Clearly, as the film thickness decreases due to continued etching, the reflected and refracted light will alternately constructively interfere and destructively interfere. As shown in FIG. 5 (which represents the inverted voltage signal generated by a sensor that is monitoring light associated with carbon monoxide, a plasma etching product), the resulting voltage signal generated by the sensor 140 includes a fairly constant (or gradually increasing) component from the light received directly from the plasma by the sensor 140, and superimposed on that signal are increases and decreases in the sensor signal due to alternating constructive and destructive interference of the reflected and refracted optical signals as the thickness of the film being etched decreases.

Also shown in FIG. 5 is the fact that a false endpoint peak in the sensor's output signal typically occurs shortly (e.g., about 5 to 20 seconds) before etching of the dielectric layer is complete. The false endpoint can be easily mistaken as an indication that the etching endpoint has been reached. The time difference between the premature peak in the light intensity signal and the signal's true peak is proportional to the wavelength being monitored for a given etch-reaction rate, refractive index of the dielectric material and angle between the sensor's optical path and the wafer surface. The false endpoint in FIG. 5 is actually due to destructive interference, since the sensor signal in this Figure is inverted. However, the same false endpoint phenomenon is also observed in the sensor signals for plasma etching reactants (whose sensor signal is not inverted) and those false endpoints are caused by constructive interference.

If the etching process is stopped when this "false endpoint" is detected, all the circuits on the wafer being processed will be non-functional because the remaining dielectric material will prevent electrical contacts essential to operation of the electrical circuits being manufactured. Therefore it is very important to be able to accurately distinguish between the false endpoints and true endpoints when etching dielectric films.

It should be noted that the constructive/destructive light interference problem occurs only when etching a film that is not opaque, since opaque films cannot generate interfering optical signals. Since the main film layers used in semiconductor wafer processing that are not opaque are dielectric films, the present invention is primarily applicable to plasma etching of dielectric films. Examples of non-opaque dielectric films to which the present invention is applicable include: silicon dioxide, silicon nitride, silicate-based or siloxane-based SOG (spin on glass), polyimide, and silicon oxynitride. Silicon dioxide films to which the present application is applicable include thermally grown silicon dioxide, silicon dioxide deposited through chemical vapor deposition, TEOS (tetra ethyl orthosilicate) derived silicon dioxide, or silicon tetrahydride derived silicon dioxide.

In addition, it should be noted that use of the present invention is expected to be beneficial only when the optical path of the endpoint detection system (i.e., of the optical sensors 140) is not parallel to the wafer surface. Many plasma etchers have optical sensors that are parallel to the wafer surface, and those systems should not have a problem with constructively interfering optical signals because the optical sensors in those systems receive only light transmitted directly from the plasma and do not receive optical signals reflected and refracted by the wafer being processed. However, plasma etchers having an optical sensor with an optical path not parallel to the wafer surface may have smaller plasma chambers than plasma etchers with optical sensors whose optical path is parallel to the wafer surface, and therefore wafer etchers with non-parallel optical path optical sensors may have an advantage.

The wavelengths and corresponding reactants/products for two examples of etching endpoint detection processes in accordance with the present invention are as follows:

| Film | Etchant | Species | Wavelength (nm) |
| --- | --- | --- | --- |
| SiO$_2$ | Flurocarbon-based | CO (product) | 561 |
|  |  | CF$_2$ (reactant) | 275 |
| Si$_3$N$_4$ | Flurocarbon-based | F (reactant) | 704 |
|  |  | CN (product) | 387 |

FIG. 5 represents the endpoint detection signal generated by monitoring light at the 561 nm wavelength (corresponding to carbon monoxide) when etching a silicon dioxide film with a fluorocarbon plasma. In the example shown in FIG. 5, when monitoring a single optical wavelength with a prior art endpoint detection system, the signal level of the endpoint detection signal at the false endpoint is approximately twenty percent of the signal level of the endpoint detection signal at the true endpoint. Thus, the "signal to noise ratio" of that endpoint detection system is about 5 to 1.

Figure 6:
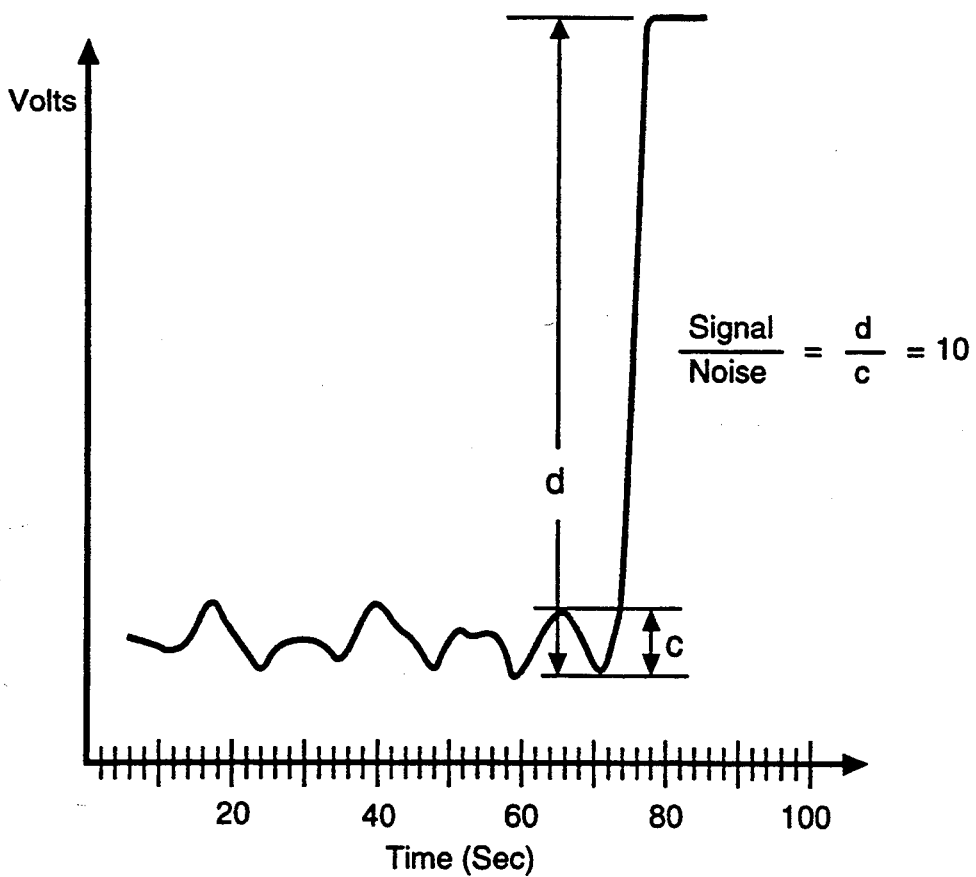
FIG. 6 shows an optical intensity trace characteristic of the present invention.

FIG. 6 represents the endpoint detection signal generated by monitoring light a two wavelengths, 561 nm and 275 nm, and forming an endpoint detection signal equal to a mathematical combination of the two light intensity signals. Light having a wavelength of 275 nm corresponds to carbon fluoride, which is a reactant whose concentration increases at the etching endpoint. Light having a wavelength of 561 nm corresponds to carbon monoxide, which is a reaction product whose concentration decreases at the etching endpoint. Thus the amount of light at 275 nm increases at the etching endpoint, while the amount of light at 561 nm decreases at the etching endpoint. The endpoint detection signal (EDS) generated by the controller is:

$$EDS = \text{Intensity}(275 \text{ nm}, t) - \text{Intensity}(561 \text{ nm}, t)$$

Where Intensity(275 nm, $t$) and Intensity(561 nm, $t$) are the instantaneous measured intensity of the optical signal at 275 nm and 561 nm, respectively, at time t, where time $t=0$ at the beginning of the etching process.

Since the 275 nm light intensity signal increases at the etching endpoint, while the 561 nm light intensity signal decreases at the etching endpoint, the two signals are combined by "inverting" the 561 nm light intensity signal and then adding the two signals. The signal level of the combined endpoint detection signal at the false endpoint is approximately ten percent of the signal level of the combined endpoint detection signal at the true endpoint. Thus, the "signal to noise ratio" of the improved endpoint detection system is about 10 to 1. As a result, it is easier to distinguish the true endpoint from the premature peak in the endpoint detection signal when using the combined endpoint detection signal of the present invention.

Figure 7:
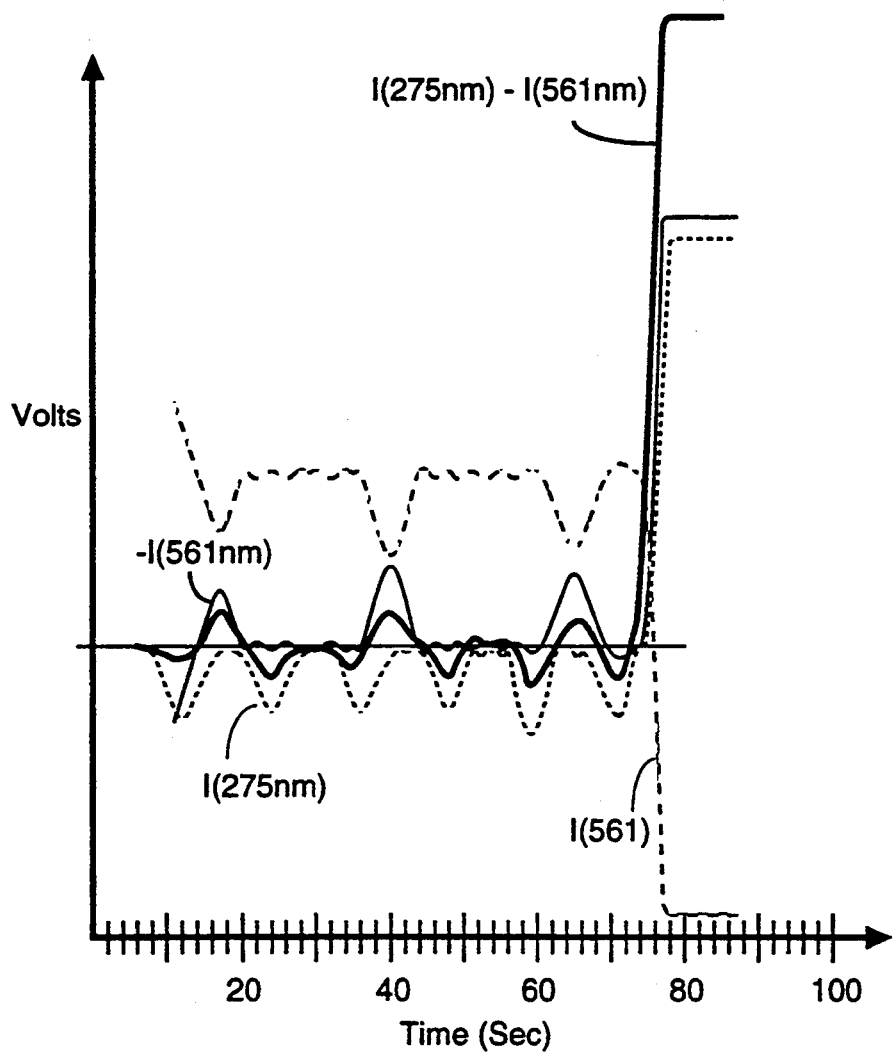
FIG. 7 shows optical intensity traces of a reactant and an etching product having characteristic wavelengths that differ by approximately a factor of 2.

FIG. 7 shows the light intensity signal for 275 nm, the light intensity signal for 561 nm, the inverted light intensity signal for 561 nm, and the composite signal.

Figure 8:
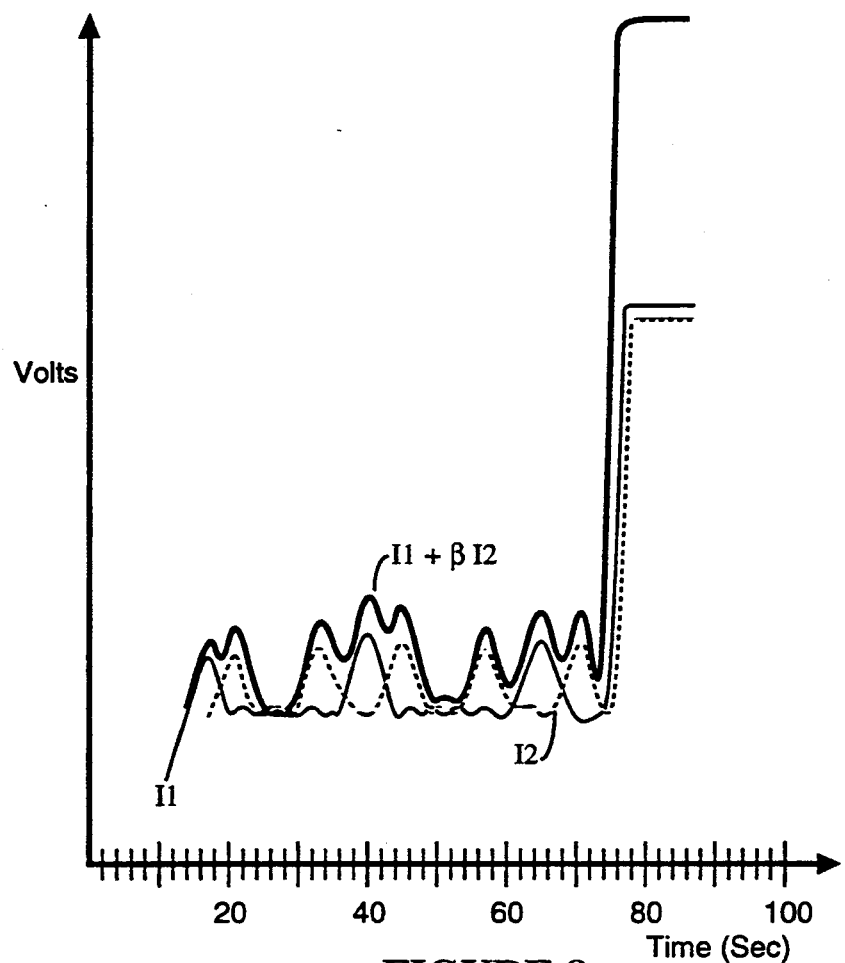
FIG. 8 shows a second set of optical intensity traces of two products having characteristic wavelengths that differ by approximately a factor of 2.

FIG. 8 shows the light intensity signals for two reactants and the composite signal obtained from adding these two signals together. The traces would be similar when combining the inverted signals for two reaction products. As can be seen, when the light intensity signals from two reactants are combined, an even greater improvement in the signal to noise ratio is obtained than when one combines the signals from a reactant and a product.

To implement this "two wavelength" endpoint detection methodology, two light sensors 140-1 and 140-2

(see FIG. 2) with narrowband filters at the assigned wavelengths are used. In the preferred embodiment of the present invention, the two wavelengths λ1 and λ2 monitored by the endpoint detection system should differ by approximately a factor of two:

$$\lambda 2 \approx 2 \times \lambda 1$$

so that the combination of the two light intensity signals will at least partially cancel each other when the film being etched has a remaining thickness such that the light paths of light reflected and light refracted by the film into the light sensor differ in length by λ1, while at the same time increasing the strength of the combined endpoint signal at the true etch endpoint. More generally, the two monitored wavelengths are selected such that the combined intensity signal has a proportionally smaller false endpoint peak than either of the individual monitored intensity signals.

The general equation for the combined endpoint detection signal (EDS) that is generated by the controller is:

$$EDS = l(\lambda 1) + \beta \times l(\lambda 2)$$

where l(λ) is the intensity of the optical signal at wavelength λ, and β is a negative coefficient when the two monitored light intensity signals move in opposite directions at the etch endpoint. The value of β can also be a non-integer so as to maximize cancellation of the false endpoint signals immediately preceding the true endpoint.

Figure 9:
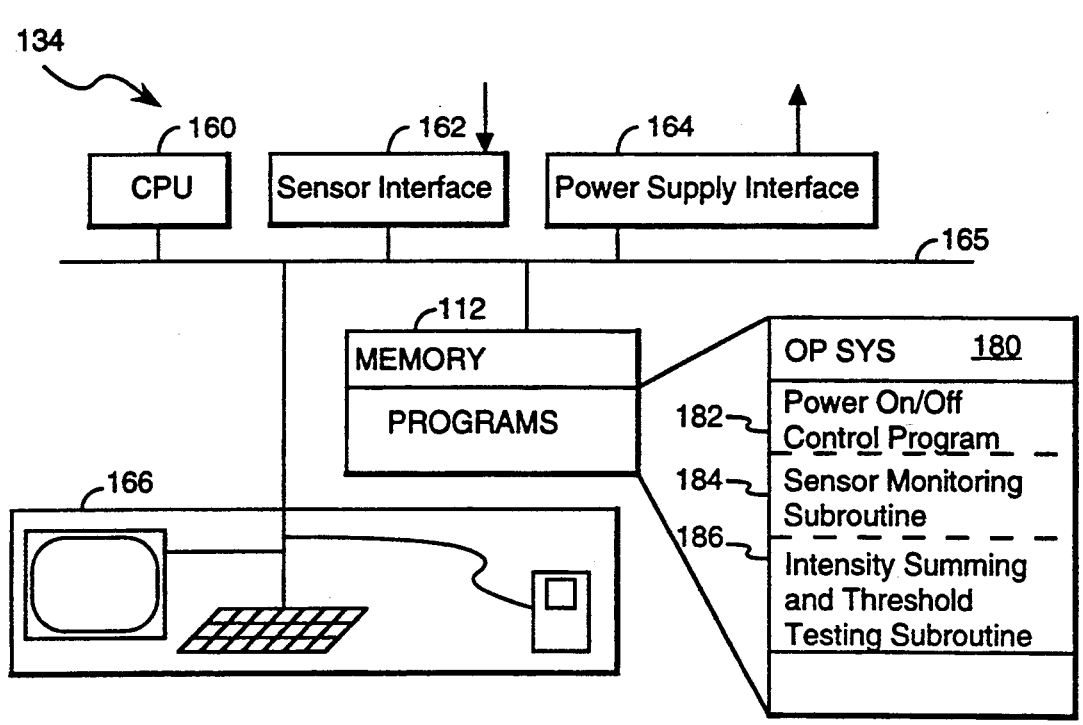
FIG. 9 is a block diagram of a controller that monitors signals from two optical sensors, generates an endpoint detection signal corresponding to a predefined mathematical combination of the two monitored signals, and stops a plasma etching process when the endpoint detection signal crosses a threshold level.

Referring to FIG. 9, the controller 134 includes a microprocessor 160, a sensor interface 162 for receiving signals from the optical sensors 140, and a power supply interface 164 for turning the power supply 130 on and off. A user interface 166 allows users to control the plasma etching system and to monitor the system's operation, including monitoring the etch endpoint detection signal. The controller's memory 112 (including both random access memory and non-volatile secondary memory) stores the controller's operating system 180, and a power on/off control program 182. The power on/off control program 182 utilizes a sensor monitoring subroutine 184 to monitor the voltage signals produced by the light intensity sensors, and an intensity summing and threshold testing subroutine 186. The testing subroutine generates a predefined mathematical combination of two monitored light intensity signals, and compares the resulting endpoint detection signal value with a threshold value. When the combined endpoint detection signal exceeds a specified threshold value for an endpoint detection signal that increases at the etch endpoint, or falls below a specified threshold for an endpoint detection signal that decreases at the etch endpoint, the power on/off program 182 turns off the plasma etcher's power supply to stop the etching process.

The precise threshold value to be used for turning off the power supply must be determined for each etching process since many process parameters will affect the intensity of the light signals produced.

For some plasma etch processes it may not be possible to find two wavelengths to monitor that differ in wavelength by precisely a factor of two. In that case, two wavelengths should be selected such that the second wavelength λ2 is approximately half (preferably between 0.4 and 0.6) of the first wavelength λ1 so as to maximize cancellation of the two monitored light intensity signals at the point that the false endpoint signal peak would otherwise be generated.

The wavelengths that can be monitored for detecting decreases in reaction products created by various plasma etching processes are listed below:

| PRODUCT | MONITORED WAVELENGTH |
| --- | --- |
| carbon monoxide (CO) | 484 nm, 561 nm |
| hydroxide (OH) | 307 nm |
| SiF$_2$ | 390 nm, 401 nm |
| SiF | 640 nm, 777 nm |
| silicon oxide (SiO) | 241 nm |
| Cyanide (CN) | 387 nm |

The wavelength(s) associated with reactants used in plasmas having halocarbon-type chemistries, which generally increase in intensity at the end of the etching process, are:

| REACTANT | MONITORED WAVELENGTH |
| --- | --- |
| CF | 240 nm, 256 nm |
| CF$_2$ | 249 nm, 275 nm |
| Fluorine (F) | 624 nm, 704 nm |

Finally, it is noted that some combinations of sensor signals, such as the sensors signals for a reactant and product when the reactant's wavelength is half that of the product, will actually produce a larger or amplified false endpoint than either of the separate sensor signals. This combination of sensor signals can be useful where the etching process is to be stopped prior to complete removal of the layer being etched with a quantifiable thickness of the remaining dielectric. For instance, when etching a dielectric layer that overlays a sandwiched metal connection layer, in some cases it is useful to leave some dielectric on top of the metal connection layer to prevent pealing of the top layer of the sandwich structure. Since the false or premature endpoint signal occurs when the remaining thickness of the film being etched corresponds to either a full or half wavelength of one of the wavelengths being monitored, depending on whether the wavelengths being monitored correspond to products or reactants and depending on the particular combination of sensor signals being used, stopping the etching process at the premature endpoint will leave a relatively well-defined amount of dielectric film remaining on the substrate.

In other instances, it will be useful to combine three or more sensor signals to produce an even flatter pre-endpoint signal than would be possible with a combination of just two sensor signals.

While the present invention has been described with reference to a preferred embodiment, the description is illustrative of the invention and is not to be construed as limiting the invention. Various modifications may occur to those skilled in the art without departing from the true spirit and scope of the invention as defined by the appended claims.

What is claimed is:

1. A method of etching a non-opaque film on a substrate, the steps of the method comprising:

etching said non-opaque film in a plasma etching chamber;

monitoring the intensity of light produced in said plasma etching chamber at a first wavelength and at a second wavelength while said etching step is being performed; said monitoring step including monitoring said intensity of light using light sensors having optical paths that are neither parallel nor perpendicular to a top surface of said non-opaque film;

generating a first and second endpoint detection signals corresponding to the monitored intensity of light produced at said first and second wavelengths, wherein both said first and second endpoint detection signals include respective premature peaks prior to completion of said etching step as well as respective end peaks at completion of said etching step;

generating a combination endpoint detection signal corresponding to a mathematical combination of said monitored intensity of light at said first wavelength and said monitored intensity of light at said second wavelength, said combination endpoint signal having an end peak at completion of said etching step and a premature peak prior to completion of said etching step, wherein said mathematical combination is defined such that said combination endpoint detection signal's premature peak is smaller relative to its end peak than said respective premature peaks of first and second endpoint detection signals are relative to their respective end peaks; and stopping said etching when said combination endpoint detection signal crosses a threshold level.

2. The method of claim 1, wherein said second wavelength is approximately half said first wavelength.

3. The method of claim 1, wherein one of said first wavelength and second wavelength is associated with a reaction product created by said etching step, and the other of said first wavelength and second wavelength is associated with a reactant used to perform said etching step.

4. The method of claim 3, said generating step including subtracting one of said monitored light intensities from the other of said monitored light intensities.

5. A method of processing a semiconductor wafer, the steps of the method comprising:

depositing and patterning a conductive interconnect layer on a said semiconductor wafer;

depositing a non-opaque dielectric film on said patterned conductive interconnect layer;

etching said non-opaque film in a plasma etching chamber;

monitoring the intensity of light produced in said plasma etching chamber at a first wavelength and at a second wavelength while said etching step is being performed; said monitoring step including monitoring said intensity of light using at least light sensors having an optical path that is neither parallel nor perpendicular to a top surface of said non-opaque film;

generating a first and second endpoint detection signals corresponding to the monitored intensity of light produced at said first and second wavelengths, wherein both said first and second endpoint detection signals include respective premature peaks prior to completion of said etching step as well as respective end peaks at completion of said etching step;

generating combination endpoint detection signal corresponding to a mathematical combination of said monitored intensity of light at said first wavelength and said monitored intensity of light at said second wavelength, wherein said first and second wavelengths and said mathematical combination are selected so as to generate an easily detected premature peak in said combination endpoint detection signal prior to completion of said etching step; and stopping said etching when said premature peak occurs in said combination endpoint detection signal so as to leave a thin layer of said non-opaque dielectric film on said patterned conductive interconnect layer.

6. The method of claim 5, wherein said second wavelength is approximately half said first wavelength.

7. The method of claim 6, wherein said first wavelength is associated with a reaction product created by said etching step, and said second wavelength is associated with a reactant used to perform said etching step.

8. The method of claim 1, said monitoring step including monitoring said intensity of light using at least one light sensor having an optical path that is oriented at about 22 degrees from a top surface of said non-opaque film.

9. The method of claim 5, said monitoring step including monitoring said intensity of light using at least one light sensor having an optical path that is oriented at about 22 degrees from a top surface of said non-opaque film.

* * * * *